(12) United States Patent
Chen

(10) Patent No.: US 10,692,898 B2
(45) Date of Patent: Jun. 23, 2020

(54) DISPLAY PANEL AND DISPLAY DEVICE

(71) Applicants: HKC Corporation Limited, Shenzhen (CN); Chongqing HKC Optoelectronics Technology Co., Ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/425,970

(22) Filed: May 30, 2019

(65) Prior Publication Data

US 2019/0280015 A1  Sep. 12, 2019

Related U.S. Application Data

(63) Continuation-in-part of application No. PCT/CN2017/106315, filed on Oct. 16, 2017.

(30) Foreign Application Priority Data

Jan. 9, 2017 (CN) .......................... 2017 1 0015170

(51) Int. Cl.
*H01L 27/12* (2006.01)
*H01L 25/18* (2006.01)
*G09G 3/36* (2006.01)

(52) U.S. Cl.
CPC ............. *H01L 27/124* (2013.01); *G09G 3/36* (2013.01); *G09G 3/3648* (2013.01); *H01L 25/18* (2013.01)

(58) Field of Classification Search
CPC ....... H01L 25/167; H01L 25/50; H01L 25/18; H01L 25/0655; H01L 25/16;
(Continued)

(56) References Cited

U.S. PATENT DOCUMENTS 8,031,314 B2* 10/2011 Aramatsu ......... G02F 1/136259
349/149
9,219,083 B1* 12/2015 Zheng .................. H01L 27/124
(Continued)

FOREIGN PATENT DOCUMENTS

CN       102566168 A       7/2012
CN       102981331 A       3/2013
(Continued)

OTHER PUBLICATIONS

Dong Zhang, the ISA written comments, Jul. 2018, CN.
(Continued)

*Primary Examiner* — Nikolay K Yushin

(57) ABSTRACT

The present application discloses a display panel and a display device. The display panel includes an array substrate including a source driver, a gate driver, a plurality of spaced-apart data lines, a plurality of spaced-apart scan lines, and a plurality of spaced-apart connecting line. The source driver is disposed at a first end of the array substrate, the gate driver is disposed at a second end of the array substrate, and the second end is opposite to the first end. The plurality of data lines are respectively connected to the source driver, the plurality of scan lines respectively intersect with the plurality of data lines, the plurality of connecting lines are respectively connected to the gate driver, and each of the connecting lines is respectively connected to one of the scan lines.

17 Claims, 4 Drawing Sheets

(58) Field of Classification Search
CPC . H01L 25/072; H01L 27/124; H01L 27/3624; H01L 27/42384; H01L 27/1255; H01L 27/3276; H01L 27/1222; G09G 3/36; G09G 3/3648; G09G 3/3677; G09G 3/3233; G09G 3/3266; G09G 3/3241
See application file for complete search history.

(56) References Cited

U.S. PATENT DOCUMENTS

2010/0066967 A1 3/2010 Takahashi et al.
2012/0002130 A1 1/2012 Watanabe

FOREIGN PATENT DOCUMENTS

| CN | 104731405 A | | 6/2015 | | |
| CN | 104795043 A | | 7/2015 | | |
| CN | 104934458 A | | 9/2015 | | |
| CN | 105425490 | * | 3/2016 | ........... | G02F 1/1362 |
| CN | 105425490 A | | 3/2016 | | |
| CN | 105977264 A | | 9/2016 | | |
| CN | 106710553 A | | 5/2017 | | |

OTHER PUBLICATIONS

Dong Zhang, the International Search Report, dated Jul. 2018, CN.
Songjiang Wu, the ISA written comments, Dec. 2017. CN.
Songjiang Wu, the International Search Report, dated Dec. 2017, CN.

* cited by examiner

DISPLAY PANEL AND DISPLAY DEVICE

The present application is a continuation-in-part of application No. PCT/CN2017/106315 filed on Oct. 16, 2017, which claims the benefit of Chinese Patent Application No. CN2017100151700 filed on Jan. 9, 2017, and entitled "PIXEL STRUCTURE AND DISPLAY PANEL". The entire contents of the above applications are hereby incorporated by reference in their entirety.

TECHNICAL FIELD

The present application relates to the technical field of display, and in particular, to a display panel and a display device.

BACKGROUND

Liquid crystal displays have many advantages such as thin bodies, power saving and no radiation, and have been widely used. Most of the liquid crystal displays on the market are backlight type liquid crystal displays which each include a liquid crystal panel and a backlight module. The working principle of the liquid crystal panel is that liquid crystal molecules are placed between two parallel glass substrates and a driving voltage is applied on the two glass substrates to control the rotating direction of the liquid crystal molecules, so as to refract light of the backlight module to generate a picture.

A thin film transistor-liquid crystal display (TFT-LCD) has gradually occupied a dominant position in the display field due to its low power consumption, excellent picture quality and high production yield and the like. Similarly, the thin film transistor-liquid crystal display includes a liquid crystal panel and a backlight module, where the liquid crystal panel includes a color filter (CF) substrate and a thin film transistor (TFT) substrate. Transparent electrodes are present on the opposite inner sides of the aforementioned substrates. A layer of liquid crystal (LC) molecules is sandwiched between the two substrates. The liquid crystal panel changes a polarization state of light by controlling the orientation of the liquid crystal molecules by an electric field, and the penetration and blocking of an optical path are implemented through a polarizer, to achieve the goal of display.

A source driver, a gate driver, a plurality of data lines, and a plurality of scan lines are disposed on an array substrate of the existing liquid crystal panel, where the source driver is connected to the plurality of data lines, and the gate driver is connected to the plurality of scan lines. The plurality of scan lines and the plurality of data lines are cross on the array substrate, the source driver is mounted and fixed at an end position of the array substrate, and the gate driver is mounted and fixed on one side position or two side positions of the array substrate. It is not easy for the existing liquid crystal panel to achieve a narrow border.

SUMMARY

The present application provides a display panel capable of achieving a narrow border design.

In addition, the present application also provides a display device including the above display panel to achieve a narrow border design.

According to an aspect of the present application, the present application discloses a display panel, the display panel includes an array substrate, and the array substrate includes:

a source driver, which is disposed at a first end of the array substrate;

a gate driver, which is disposed at a second end of the array substrate, where the second end is opposite to the first end;

a plurality of spaced-apart data lines, where the plurality of data lines are respectively connected to the source driver;

a plurality of spaced-apart scan lines, where the plurality of scan lines intersect with the plurality of data lines respectively; and a plurality of spaced-apart connecting lines, where the plurality of connecting lines are respectively connected to the gate driver, and each of the connecting lines is connected to one of the scan lines.

The lengths of the plurality of connecting lines gradually increase from a first side of the array substrate to a second side of the array substrate, and the plurality of connecting lines are sequentially connected with the plurality of scan lines from the first side of the array substrate. The first side is opposite to the second side. The lengths of the plurality of connecting lines gradually increase from the first side of the array substrate to the second side which is the other side, and the plurality of connecting lines are sequentially connected to the scan line from the first side to the second side, which not only facilitates installation and production, but also makes the arrangement of the array substrate compact.

The plurality of connecting lines are arranged in parallel with each other. The plurality of connecting lines are arranged in parallel with each other, and the connecting lines can be laid on the same layer of the array substrate, which not only facilitates wiring, but also makes the arrangement of the array substrate more compact.

The plurality of connecting lines and the plurality of data lines are arranged in parallel. In the present application, a plurality of connecting lines and a plurality of data lines are further arranged in parallel, so that the connecting lines and the data lines can be laid on the same layer of the array substrate, which further facilitates the wiring and makes the arrangement of the array substrate more compact.

The display panel includes a first conductive layer and a second conductive layer, the scan lines are located at the first conductive layer, the connecting lines are disposed at the second conductive layer; conductive holes are formed in the intersection positions of the connecting lines and the corresponding scan lines; and the connecting lines are electrically connected with the corresponding scan lines through the conductive holes. The scan lines and the connecting lines are disposed at the first conductive layer and the second conductive layer of the display panel respectively, so that the scan lines and the connecting lines are separated from each other, and the scan lines and the connecting lines are connected through the conductive holes only at the corresponding positions, to prevent the scan lines and the data lines from being chaotic during the wiring.

Each of the connecting lines is disposed between two adjacent ones of the data lines. The connecting lines and the data lines are laid apart from each other, which prevents the connecting lines and the data lines from overlapping, thereby preventing the connecting lines and the data lines from overlapping and generating parasitic capacitance.

The data line includes a first data line and a second data line which are adjacent; the connecting line includes a first connecting line, and the scan line includes a first scan line; the array substrate includes a first active switch and a first pixel, and the first active switch is respectively coupled to the first scan line, the first data line and the first pixel; the first active switch and the first pixel are disposed between the first data line and the second data line; the first connecting line is connected to the first scan line, and the first connecting line is disposed between the first pixel and the second data line. The first connecting line is disposed between the first pixel and the second data line, so that the first connecting line is prevented from being arranged at the position of the first pixel and affecting the normal development of the first pixel.

A vertical shift register circuit of the gate driver is disposed at a first end of the array substrate. It is convenient to electrically connect the vertical shift register circuit with the connecting line.

A pin of the source driver is bound to the edge of the array substrate.

The length of the gate driver is less than or equal to the width of a display area in the display panel. The length of the gate driver is configured to be less than or equal to the width of the display area in the display panel, so that the display panel achieves a better effect of narrow borders.

The gate driver is located at the top of the array substrate, and the source driver is located at the bottom of the array substrate. This is a specific way of arranging the gate driver and the source driver in the present application. Of course, the source driver can also be disposed at the top of the array substrate, and the gate driver can be disposed at the bottom of the array substrate.

According to another aspect of the present invention, the present application also discloses a display device including a backlight module and the display panel as described above.

Since the gate driver is mounted and fixed to one or both sides of the array substrate, the space on the side of the array substrate is excessively occupied, so that the frame size of the liquid crystal panel is too large, and thus the width of the frame cannot be further reduced. The display panel of the present application makes the source driver and the gate driver oppositely disposed at the first end and the second end of the array substrate, and the source driver is connected with the plurality of data lines; the gate driver is connected with the scan lines through the connecting lines, and each connecting line is connected with one scan line, so that the gate driver can normally drive the scan line through the connecting line. Therefore, the gate driver of the present application is disposed at the opposite end of the source driver without occupying the space of the side position of the array substrate, so that the narrow border or no border of the display panel can be achieved.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DETAILED DESCRIPTION

Figure 1:
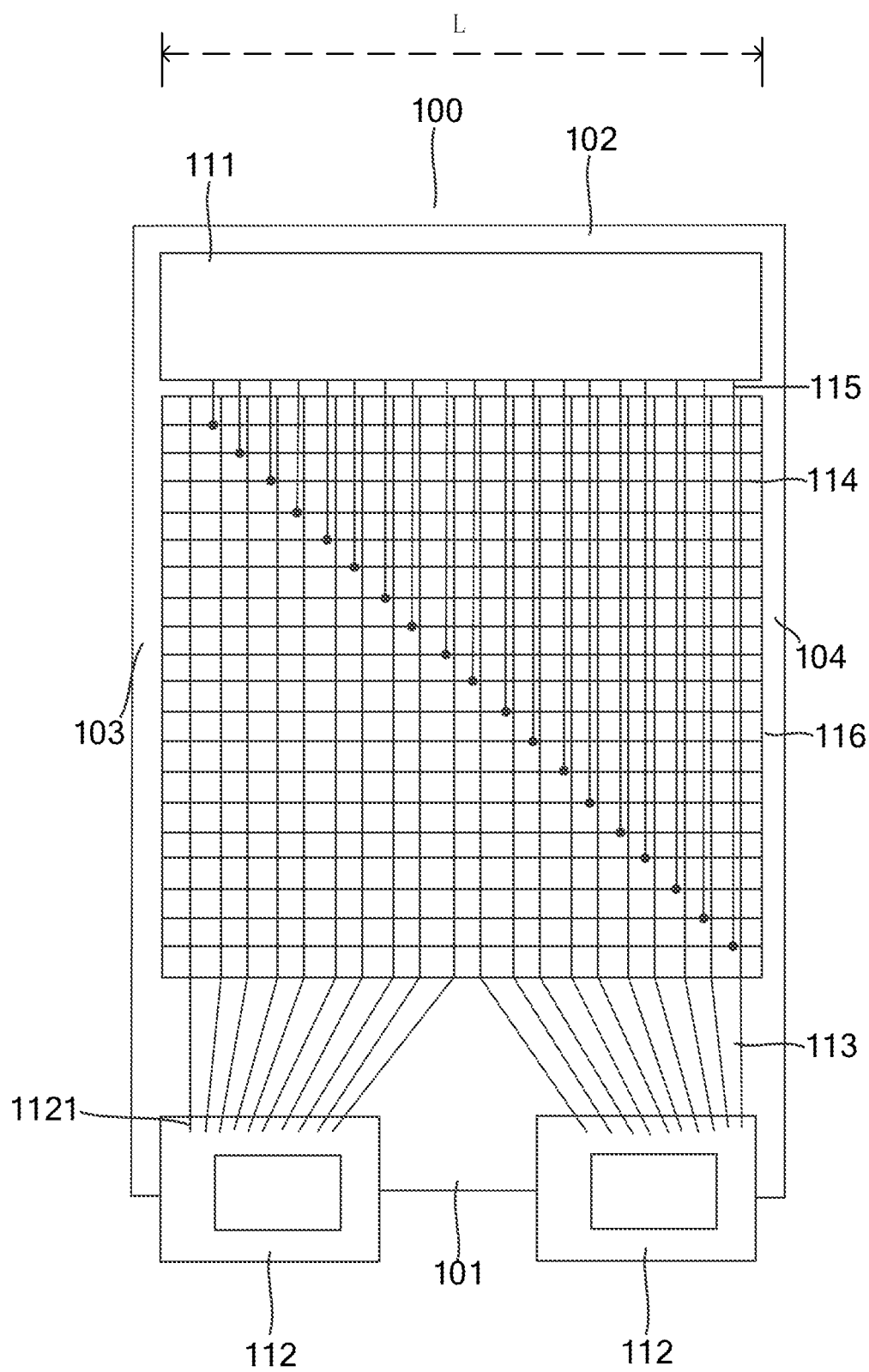
FIG. 1 is a schematic structural view of a display panel according to an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms "first", "second" are merely for a descriptive purpose, and cannot to be understood to indicate or imply a relative importance, or implicitly indicate the number of the indicated technical features. Hence, the features defined by "first", "second" can explicitly or implicitly include one or more of the features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood for those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

A display panel and a display device according to embodiments of the present application are described below with reference to FIGS. 1 to 4.

The present application will be further described in detail below with reference to FIGS. 1 to 4 and specific embodiments.

Figure 2:
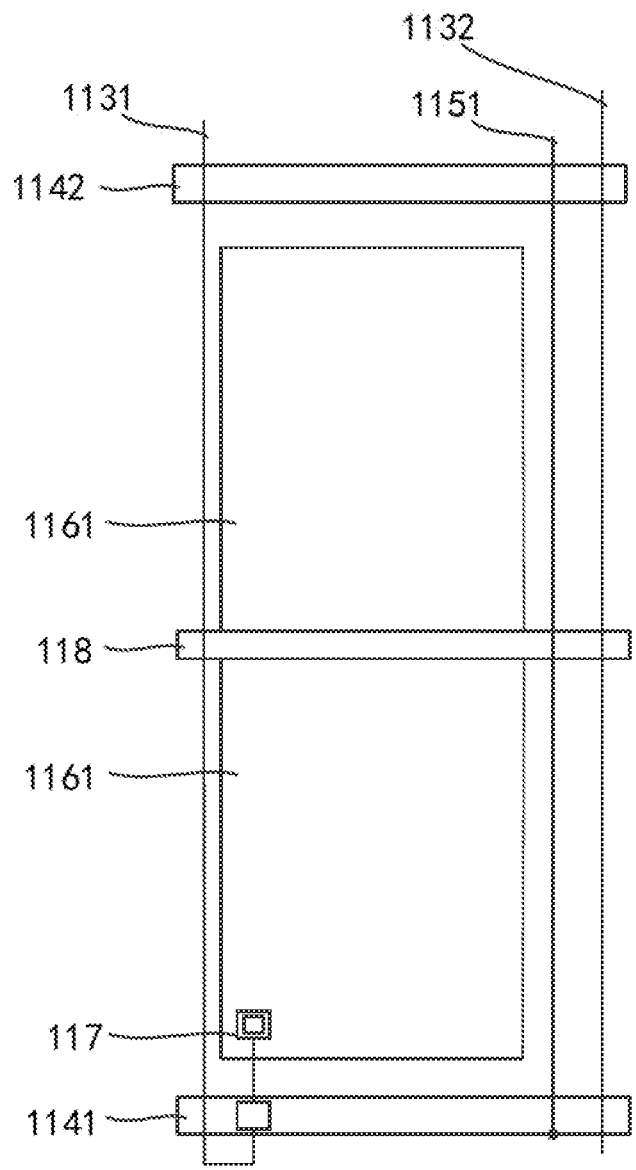
FIG. 2 is a schematic view of a partial structure of a display panel according to an embodiment of the present application.
Figure 3:
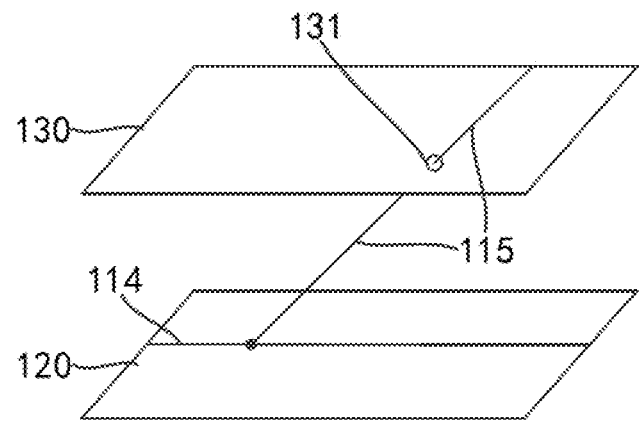
FIG. 3 is a schematic view of a partial structure of a display panel according to an embodiment of the present application.
Figure 4:
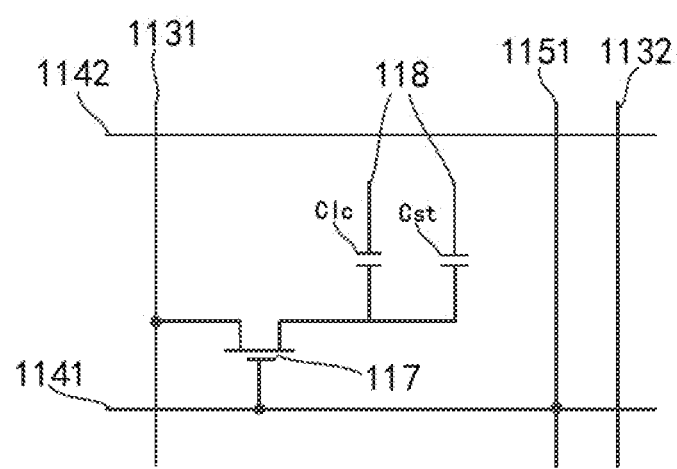
FIG. 4 is an equivalent circuit board view of FIG. 2.

In an embodiment of the present application, as shown in FIGS. 1 to 3, FIG. 1 is a schematic structural view of a display panel according to an embodiment of the present application, and FIG. 2 is a schematic view of a partial structure of a display panel according to an embodiment of the present application, i.e., FIG. 2 is a schematic view of a partial structure of FIG. 1. Specifically, FIG. 2 is a schematic view of a pixel structure in the display panel. FIG. 3 is a partial schematic view of a display panel according to an embodiment of the present application, and FIG. 4 is a circuit view according to an embodiment of the present application, and is specifically an equivalent circuit view of FIG. 2. A display panel 100 of this embodiment includes an array substrate 110, and the array substrate 110 includes a source driver 112, a gate driver 111, a plurality of spaced-apart data lines 113, a plurality of spaced-apart scan lines 114, and a plurality of spaced-apart connecting line 115.

The source driver 112 is disposed at a first end 101 of the array substrate 110; the gate driver 111 is disposed at a second end 102 of the array substrate 110, and the second end 102 is opposite to the first end 101, i.e., the second end 102 is the other end opposite to the first end 101; the plurality of data lines 113 are respectively connected to the source driver 112; the plurality of scan lines 114 and the plurality of data lines 113 intersect; the plurality of connecting lines 115 are respectively connected to the gate driver 111, and each of the connecting lines 115 is connected to one of the scan lines 114.

The display panel 100 of the present application makes the source driver 112 and the gate driver 111 oppositely disposed at the first end 101 and the second end 102 of the array substrate 110, and the source driver 112 is connected with the plurality of data lines 113; the gate driver 111 is connected with the scan lines 114 through the connecting lines 115, and each connecting line 115 is connected with one scan line 114, so that the gate driver 111 can normally drive the scan line 114 through the connecting line 115. Therefore, the gate driver 111 of the present application is disposed at the opposite end of the source driver 112 without occupying the space of the side position of the array substrate 110, so that the narrow border or no border of the display panel 100 can be achieved.

The lengths of the plurality of connecting lines 115 gradually increase from a first side 103 of the array substrate 110 to a second side 104 of the array substrate 110, and the plurality of connecting lines 115 are sequentially connected with the plurality of scan lines 114 from the first side 103 of the array substrate 110; and the first side 103 is opposite to the second side 104, i.e., the first side 103 is the other side opposite to the second side 104. The lengths of the plurality of connecting lines 115 gradually increase from the first side 103 of the array substrate 110 to the second side which is the other side, and the plurality of connecting lines are sequentially connected to the scan line 114 from the first side 103 to the second side 104, which not only facilitates installation and production, but also makes the arrangement of the array substrate compact. However, it should be noted that the wiring manner of the connecting lines of this embodiment is not limited to this. For example, the lengths of the connecting lines from the second side of the array substrate to the first side of the array substrate gradually increase. For another example: set the connecting lines to be of the same length, and only perform electrical connection at the positions where the connecting lines need to be connected with the scan lines.

Further, the plurality of connecting lines 115 are arranged in parallel with each other. The plurality of connecting lines 115 are arranged in parallel with each other, and the connecting lines 115 can be laid on the same layer of the array substrate, which not only facilitates wiring, but also makes the arrangement of the array substrate 110 more compact. However, it should be noted that the connecting lines may also be arranged not in parallel.

Further, the plurality of connecting lines 115 and the plurality of data lines 113 are arranged in parallel. In an embodiment of the present application, the plurality of connecting lines 115 and the plurality of data lines 113 are arranged in parallel with each other, and the connecting lines 115 and the data lines 113 can be laid on the same layer of the array substrate 110, which not only facilitates wiring, but also makes the arrangement of the array substrate 110 more compact.

As shown in FIG. 3, the display panel 100 includes a first conductive layer 120 and a second conductive layer 130; the scan lines 114 are located at the first conductive layer 120; and the connecting lines 115 are disposed at the second conductive layer 130; conductive holes 131 are formed in the positions where the connecting lines 115 and the corresponding scan line 114 intersect; and the connecting lines 115 are electrically connected with the corresponding scan line 114 through the conductive holes 131. The scan lines 114 and the connecting lines 115 are disposed at the first conductive layer 120 and the second conductive layer 130 of the display panel 100 respectively, so that the scan lines 114 and the connecting lines 115 are separated from each other, and the scan lines 114 and the connecting lines 115 are connected through the conductive holes 131 only at the corresponding positions, to prevent the scan lines 114 and the data lines 115 from being chaotic during the wiring.

Each of the connecting lines 115 is disposed between two adjacent ones of the data lines 113. The connecting lines and the data lines are laid apart from each other, which prevents the connecting lines and the data lines from overlapping, thereby preventing the connecting lines and the data lines from overlapping and generating parasitic capacitance.

Specifically, as shown in FIG. 2 and FIG. 4, in one pixel structure, the data line 113 includes a first data line 1131 and a second data line 1132 which are adjacent, and the connecting line 115 includes a first connecting line 1151; and the scan line 114 includes a first scan line 1141 and a second scan line 1142. The array substrate 110 includes a first active switch 117 and a first pixel 1161, the first active switch 117 is coupled to the first scan line 1141, the first data line 1131, and the first pixel 1161. The first active switch 117 and the first pixel 1161 are disposed between the first data line 1131 and the second data line 1132, the first connecting line 1151 is connected with the first scan line 1141, and the first connecting line 1151 is disposed between the first pixel 1161 and the second data line 1132. The second data line 1132 is located in the next row of the first data line 1131; where the second scan line 1142 is located on the last row of the first scan line 1141. In an embodiment of the present application, the first connecting line 1151 is disposed between the first pixel 1161 and the second data line 1132, to prevent the first connecting line 1151 from being disposed at the position of the first pixel 1161 and affecting the normal development of the first pixel 1161. It should be noted that FIG. 2 only shows the structure of a pixel of the display panel 100, and for other pixel structures in the display panel, references can also be made to FIG. 2, which will not be described in detail herein.

The array substrate 100 further includes a common line 118, and the connecting line 115 covers the common line 118. Specifically, as shown in FIG. 2, the first connecting line 1151 covers the common line 118.

In this embodiment, the first active switch 117 and the common line 118 are coupled, and a pixel capacitor Clc and a storage capacitor Cst are disposed between the first active switch 117 and the common line 118 to drive the display panel normally.

In this embodiment, the gate driver includes a vertical shift register circuit, and the vertical shift register circuit is disposed at a first end of the array substrate, thereby facilitating electrical connection between vertical shift register circuit and the connecting line.

In this embodiment, a pin of the source driver is bound to the edge of the array substrate.

In this embodiment, the length of the gate driver 111 is less than or equal to the width of a display area 116 in the display panel 100. The length of the gate driver 111 is less than or equal to the width of a display area 116 in the display panel 100, so that the display panel 100 achieves a better narrow frame effect. In this embodiment, the length of the gate driver 111 is preferably set equal to the width of the display area 116. Of course, it should be noted that, in this embodiment, it is also possible to set the length of the gate driver 111 to be slightly larger than the display area.

The gate driver 111 is located at the top of the array substrate 110, and the source driver 112 is located at the bottom of the array substrate 110. This is a specific way of arranging the gate driver and the source driver in the present application. Of course, the source driver can also be disposed at the top of the array substrate, and the gate driver can be disposed at the bottom of the array substrate.

In this embodiment, the display panel 100 further includes a color filter substrate, and the color filter substrate and the array substrate are oppositely disposed. However, it should be noted that the arrangement of the color filter substrate and the array substrate of the display panel of this embodiment is not limited thereto. For example, in this embodiment, the color filter substrate and the array substrate of the display panel 100 are integrally disposed on the same substrate.

Figure 5:
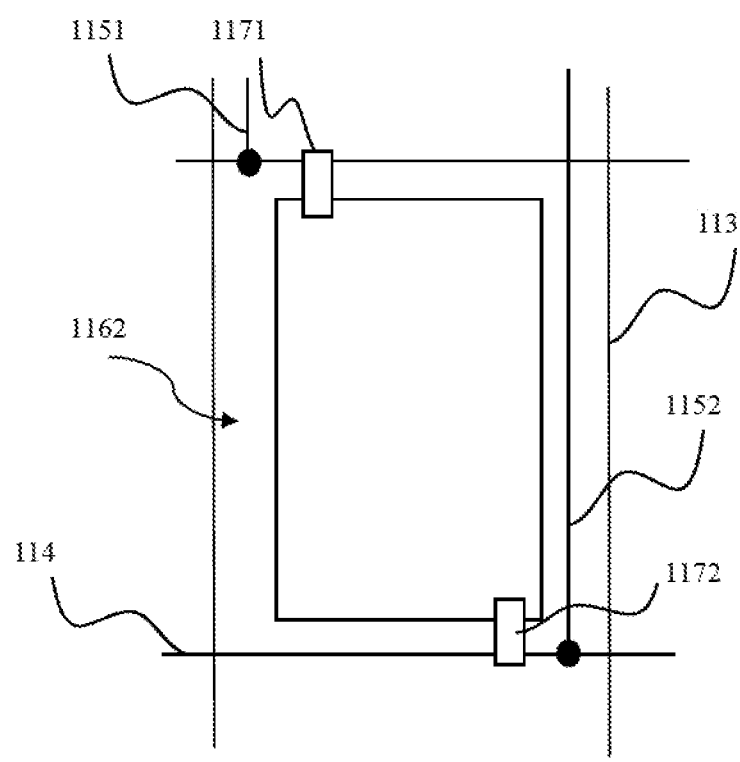
FIG. 5 is a schematic view of a partial structure of a display panel according to an embodiment of the present application.

As shown in FIG. 5, in some embodiments, each pixel structure 1162 on the array substrate can include a plurality of active switches (e.g., 2 TFTs) 1171, 1172. In each of the pixel structures 1162, a plurality of connection lines 115 are correspondingly connected to the plurality of scan lines 114 to be electrically connected to the plurality of active switches 1171, 1172.

The present application also discloses a display device, where the display device includes the above display panel and a backlight module. For the display panel of this embodiment, references can be made to the display panel in the above embodiment, and FIG. 1 and FIG. 2. The display panel will not be described in detail in this embodiment. The display device of this embodiment may be, for example, a liquid crystal display, an organic light-emitting diode (OLED) display, a quantum dot light-emitting diode (QLED) display, a curved display, or other displays. When the display device of the embodiment of the present application is a liquid crystal display, the backlight module can be used as a light source for providing sufficient brightness and light with uniform distribution. The backlight module of this embodiment can be of a front light type, and may also be of a backlight type. It should be noted that the backlight module of this embodiment is not limited thereto.

The above are further detailed descriptions of the present application in conjunction with the specific preferred embodiments, and the embodiments of the present application are not limited to these descriptions. For a person of ordinary skill in the art to which the present application pertains, a number of simple deductions or substitutions may also be made without departing from the concept of the present application. All these should be considered as falling within the scope of protection of the present application.

What is claimed is:

1. A display panel, comprising an array substrate, wherein the array substrate comprises:
    a source driver, which is disposed at a first end of the array substrate;
    a gate driver, which is disposed at a second end of the array substrate, wherein the second end is opposite to the first end;
    a plurality of spaced-apart data lines, wherein the plurality of spaced-apart data lines are respectively connected to the source driver;
    a plurality of spaced-apart scan lines, wherein the plurality of spaced-apart scan lines intersect with the plurality of spaced-apart data lines respectively; and
    a plurality of spaced-apart connecting lines, wherein the plurality of spaced-apart connecting lines are respectively connected to one of the spaced-apart scan lines;
    lengths of the plurality of spaced-apart connecting lines gradually increase from a first side of the array substrate to a second side of the array substrate, the plurality of spaced-apart connecting lines are sequentially connected with the plurality of spaced-apart scan lines from the first side of the array substrate, and the first side is opposite to the second side;
    the plurality of spaced-apart connecting lines are arranged in parallel with each other; the plurality of spaced-apart connecting lines and the plurality of spaced-apart data lines are arranged in parallel; each of the spaced-apart connecting lines is disposed between two adjacent data lines;
    the display panel comprises a first conductive layer and a second conductive layer; the spaced-apart scan lines are located at the first conductive layer; the spaced-apart connecting lines are disposed at the second conductive layer; conductive holes are formed in the positions where the spaced-apart connecting lines and the corresponding spaced-apart scan line intersect; and the spaced-apart connecting lines are electrically connected with the corresponding spaced-apart scan line through the conductive holes;
    the spaced-apart data line comprises a first data line and a second data line which are adjacent, the spaced-apart connecting line comprises a first connecting line, the spaced-apart scan line comprises a first scan line, the array substrate comprises a first active switch and a first pixel, and the first active switch is respectively coupled to the first scan line, the first data line, and the first pixel; the first active switch and the first pixel are disposed between the first data line and the second data line, the first connecting line is connected to the first scan line, and the first connecting line is disposed between the first pixel and the second data line;
    a pin of the source driver is bound to the edge of the array substrate; and a length of the gate driver is less than or equal to that of a display area in the display panel.

2. A display panel, comprising an array substrate, wherein the array substrate comprises:

a source driver, which is disposed at a first end of the array substrate;

a gate driver, which is disposed at a second end of the array substrate, wherein the second end is opposite to the first end;

a plurality of spaced-apart data lines, wherein the plurality of spaced-apart data lines are respectively connected to the source driver;

a plurality of spaced-apart scan lines, wherein the plurality of spaced-apart scan lines intersect with the plurality of spaced-apart data lines respectively;

a plurality of spaced-apart connecting lines, wherein the plurality of spaced-apart connecting lines are respectively connected to the gate driver, and each of the spaced-apart connecting lines is connected to one of the spaced-apart scan lines.

3. The display panel according to claim 2, wherein lengths of the plurality of spaced-apart connecting lines gradually increase from a first side of the array substrate to a second side of the array substrate, the plurality of spaced-apart connecting lines are sequentially connected with the plurality of spaced-apart scan lines from the first side of the array substrate, and the first side is opposite to the second side.

4. The display panel according to claim 2, wherein the plurality of spaced-apart connecting lines are disposed in parallel with each other; and the plurality of spaced-apart connecting lines and the plurality of spaced-apart data lines are disposed in parallel.

5. The display panel according to claim 2, wherein the display panel comprises a first conductive layer and a second conductive layer; the scan lines are located at the first conductive layer; the spaced-apart connecting lines are disposed at the second conductive layer; conductive holes are formed in the positions where the spaced-apart connecting lines and the corresponding spaced-apart scan line intersect; and the spaced-apart connecting lines are electrically connected with the corresponding spaced-apart scan line through the conductive holes.

6. The display panel according to claim 2, wherein a pin of the source driver is bound to the edge of the array substrate.

7. The display panel according to claim 2, wherein a length of the gate driver is less than or equal to the width of a display area in the display panel.

8. The display panel according to claim 2, wherein each of the spaced-apart connecting lines is disposed between two adjacent ones of the spaced-apart data lines.

9. The display panel according to claim 8, wherein the spaced-apart data line comprises a first data line and a second data line which are adjacent, the spaced-apart connecting line comprises a first connecting line, the spaced-apart scan line comprises a first scan line, the array substrate comprises a first active switch and a first pixel, and the first active switch is respectively coupled to the first scan line, the first data line, and the first pixel; the first active switch and the first pixel are disposed between the first data line and the second data line, the first connecting line is connected to the first scan line, and the first connecting line is disposed between the first pixel and the second data line.

10. A display device, comprising a display panel, wherein the display panel comprises an array substrate, and the array substrate comprises:

a source driver, which is disposed at a first end of the array substrate;

a gate driver, which is disposed at a second end of the array substrate, wherein the second end is opposite to the first end;

a plurality of spaced-apart data lines, wherein the plurality of spaced-apart data lines are respectively connected to the source driver;

a plurality of spaced-apart scan lines, wherein the plurality of spaced-apart scan lines intersect with the plurality of spaced-apart data lines respectively;

a plurality of spaced-apart connecting lines, wherein the plurality of spaced-apart connecting lines are respectively connected to the gate driver, and each of the spaced-apart connecting lines is connected to one of the scan lines.

11. The display device according to claim 10, wherein lengths of the plurality of spaced-apart connecting lines gradually increase from a first side of the array substrate to a second side of the array substrate, the plurality of spaced-apart connecting lines are sequentially connected with the plurality of spaced-apart scan lines from the first side of the array substrate, and the first side is opposite to the second side.

12. The display device according to claim 10, wherein the plurality of spaced-apart connecting lines are disposed in parallel with each other; and the plurality of spaced-apart connecting lines and the plurality of spaced-apart data lines are disposed in parallel.

13. The display device according to claim 10, wherein the display panel comprises a first conductive layer and a second conductive layer; the spaced-apart scan lines are located at the first conductive layer; the spaced-apart connecting lines are disposed at the second conductive layer; conductive holes are formed in the positions where the spaced-apart connecting lines and the corresponding spaced-apart scan line intersect; and the spaced-apart connecting lines are electrically connected with the corresponding scan line through the conductive holes.

14. The display device according to claim 10, wherein a pin of the source driver is bound to the edge of the array substrate.

15. The display device according to claim 10, wherein a length of the gate driver is less than or equal to the width of a display area in the display panel.

16. The display device according to claim 10, wherein each of the spaced-apart connecting lines is disposed between two adjacent ones of the data lines.

17. The display device according to claim 16, wherein the spaced-apart data line comprises a first data line and a second data line which are adjacent, the spaced-apart connecting line comprises a first connecting line, the spaced-apart scan line comprises a first scan line, and the array substrate comprises a first active switch and a first pixel, and the first active switch is respectively coupled to the first scan line, the first data line, and the first pixel; the first active switch and the first pixel are disposed between the first data line and the second data line, the first connecting line is connected to the first scan line, and the first connecting line is disposed between the first pixel and the second data line.

* * * * *